United States Patent
Wu et al.

(10) Patent No.: US 11,145,722 B2
(45) Date of Patent: Oct. 12, 2021

(54) HEAVILY DOPED BURIED LAYER TO REDUCE MOSFET OFF CAPACITANCE

(71) Applicant: Analog Devices, Inc., Norwood, MA (US)

(72) Inventors: Pengfei Wu, Stoneham, MA (US); Susan L. Feindt, Andover, MA (US); F. Jacob Steigerwald, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/293,464

(22) Filed: Mar. 5, 2019

(65) Prior Publication Data
US 2020/0286997 A1 Sep. 10, 2020

(51) Int. Cl.
| | | |
|---|---|---|
| H01L 29/10 | (2006.01) | |
| H01L 27/07 | (2006.01) | |
| H01L 21/74 | (2006.01) | |
| H01L 29/66 | (2006.01) | |
| H01L 29/78 | (2006.01) | |
| H01L 29/08 | (2006.01) | |
| H01L 29/73 | (2006.01) | |

(52) U.S. Cl.
CPC ........ *H01L 29/1083* (2013.01); *H01L 21/743* (2013.01); *H01L 27/0711* (2013.01); *H01L 29/0847* (2013.01); *H01L 29/1095* (2013.01); *H01L 29/66409* (2013.01); *H01L 29/7302* (2013.01); *H01L 29/78* (2013.01)

(58) Field of Classification Search
None
See application file for complete search history.

(56) References Cited

U.S. PATENT DOCUMENTS

| | | |
|---|---|---|
| 6,555,839 B2 | 4/2003 | Fitzgerald |
| 8,471,343 B2 | 6/2013 | Doris et al. |
| 10,312,244 B2 * | 6/2019 | Li .................... H01L 21/30604 |

(Continued)

FOREIGN PATENT DOCUMENTS

CN 111668288 A 9/2020

OTHER PUBLICATIONS

Inaba, Satoshi, et al., "SODEL FET: Novel Channel and Source/Drain Profile Engineering Schemes by Selective Si Epitaxial Growth Technology", IEEE Transactions on Electron Devices, 51(9), (Sep. 2004), 1401-1408.

(Continued)

*Primary Examiner* — Benjamin P Sandvik
(74) *Attorney, Agent, or Firm* — Schwegman Lundberg & Woessner, P.A.

(57) ABSTRACT

A metal-oxide semiconductor field effect transistor (MOSFET) includes a source region and a drain region of a first conductivity type. The MOSFET additionally include a body region of a second conductivity type, where the body region underlies at least a portion of the source region and the drain region. The MOSFET further includes a buried region of the first conductivity type, where the buried region is disposed between the body region and a substrate, where the buried region is configured to reduce a capacitance between the source region and the drain region in response to an indicated voltage applied between the body region and the buried region.

21 Claims, 5 Drawing Sheets

(56) References Cited

U.S. PATENT DOCUMENTS

| | | | |
|---|---|---|---|
| 2008/0203519 A1* | 8/2008 | Min | H01L 21/823493 |
| | | | 257/501 |
| 2014/0198551 A1* | 7/2014 | Louie | G11C 15/046 |
| | | | 365/49.1 |
| 2014/0252451 A1* | 9/2014 | Han | H01L 29/7841 |
| | | | 257/324 |
| 2016/0372429 A1* | 12/2016 | Cho | H01L 21/84 |
| 2017/0278846 A1 | 9/2017 | Widjaja et al. | |
| 2018/0158912 A1* | 6/2018 | Han | G11C 11/404 |
| 2018/0286984 A1* | 10/2018 | Jou | H01L 29/1087 |

OTHER PUBLICATIONS

"Taiwan Application Serial No. 109106833, Office Action dated Dec. 30, 2020", 6 pgs.

\* cited by examiner

HEAVILY DOPED BURIED LAYER TO REDUCE MOSFET OFF CAPACITANCE

FIELD OF THE DISCLOSURE

This document pertains generally, but not by way of limitation, to semiconductor devices, and more particularly, to metal-oxide semiconductor field effect transistor.

BACKGROUND

Wireless communication systems use radio frequency (RF) switches to steer signals received from one or more signal sources to circuits in the RF signal chains of these systems. Such RF switches can operate as signal gateways, such as by controlling (e.g., inhibiting or enabling) the passage or coupling of RF signals between circuits. Solid state devices, such as metal-oxide semiconductor field effect transistor (MOSFET) can be used as RF switches in some wireless communication systems. MOSFET based RF switches can provide fast switching times, high reliability, and their relatively long operating lifetimes, as compared to RF switches based on other technologies. The performance of a MOSFET based RF switch can be characterized by the insertion loss experienced by a signal being passed by the switch, input-output isolation while the switch is turned off, and the ease with which the switch can be integrated into the manufacturing process of a wireless communication system.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a MOSFET device that is usable as a RF switch and includes a heavily doped buried layer of semiconductor material. Direct current voltages can be applied to the body region of the MOSFET and to the buried layer to controllably reduce the off capacitance of the MOSFET, such as by reverse biasing the body region relative to the buried layer to deplete the body region between the buried layer and source and drain regions of the MOSFET. The reduced off capacitance can provide increased input-output (I/O) isolation compared to other MOSFET based RF switches. The MOSFET device is compatible with CMOS and BiCMOS processes used to manufacture the components some wireless communication systems and can therefore be integrated into these manufacturing processes without significant added cost or modification of the conventional MOSFET devices.

Examples of the present disclosure include a MOSFET device having a buried region of doped semiconductor material (hereinafter, "buried region") for controllably reducing off capacitance. The MOSFET device can include source and drain regions that are doped to have first conductivity type. The MOSFET device can also include a body region having a second conductivity type. The buried region can have the same conductivity type as the source and gate regions. The buried region can also be configured, such as by selecting a dopant concentration of the buried region or a distance of the buried region from the source region and the drain region, to reduce the off capacitance of the MOSFET device in response to, or while, an indicated voltage is applied between the body region and the buried region.

Other examples of the present disclosure include a circuits incorporating the MOSFET device, and methods for fabricating and operating the circuit or MOSFET device.

The present disclosure may focus on specific geometries for a MOSFET device to improve the clarity of the discussion. Other suitable MOSFET geometries, however, can be used in conjunction with the techniques and devices described herein without deviating from the scope of the present disclosure. Additionally, the present disclosure is applicable to both n-type MOSFET (NMOS) and p-type MOSFET (PMOS) devices. Various examples of the present disclosure can be used to fabricate and operate enhancement mode and depletion mode devices. Such devices can be fabricated using CMOS and silicon on insulator processes.

As used herein, a conductivity type of a device, region, or component can include an indication of whether the majority charge carriers used to conduct an electrical current using the device, region, or component are electrons or holes. In an example, a device, region, or component having a first conductivity type can be doped, or can be formed, with a material to have electrons be the majority of charge carriers, while a device, region, or component having a second conductivity type can be doped, or can be formed with a material, to have holes as the majority of charge carriers.

Figure 1:
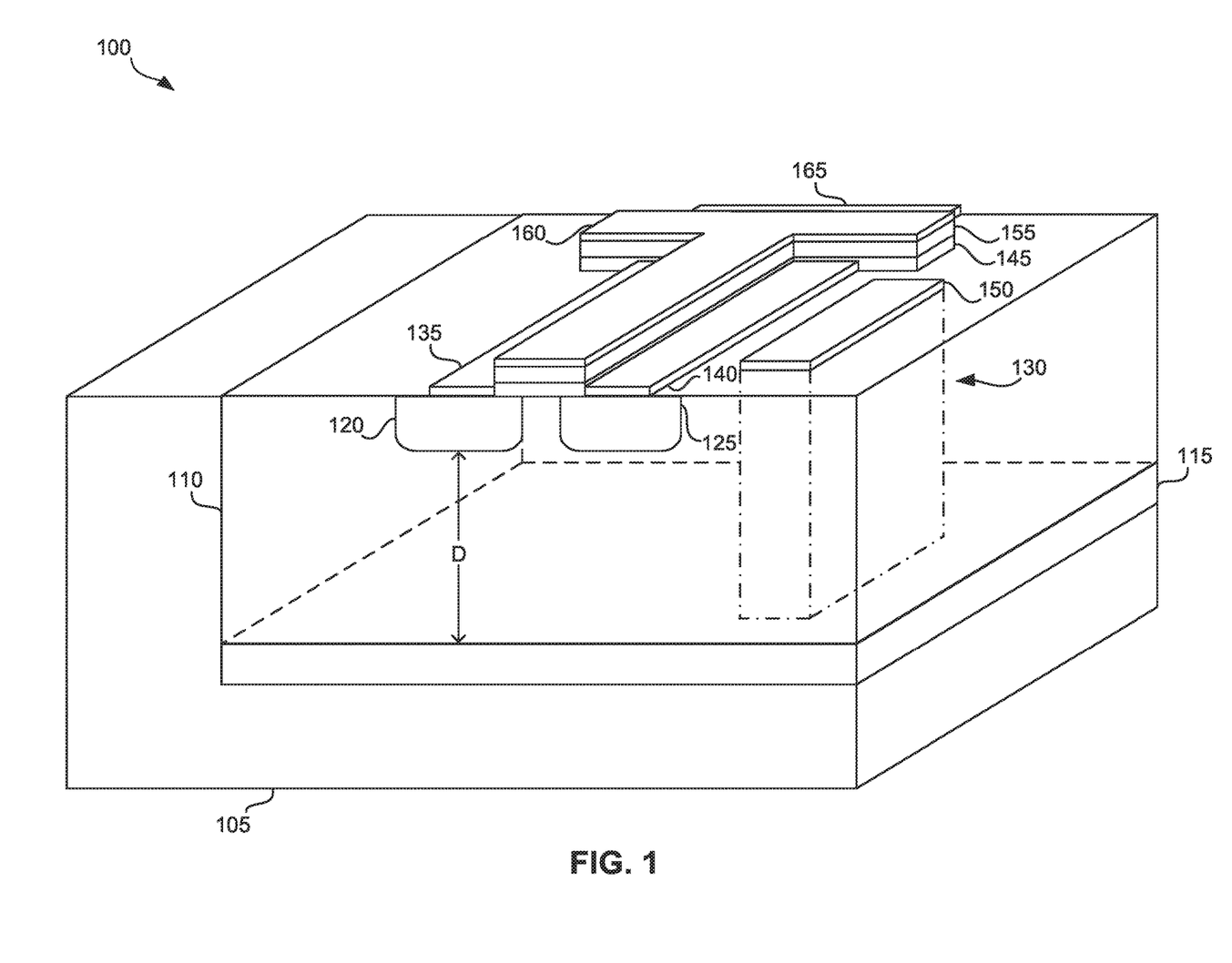
FIG. 1 illustrates an isometric diagram of an example of a metal oxide semiconductor field effect transistor having a doped buried region for controlling the off capacitance of the device, according to various embodiments.

FIG. 1 illustrates an isometric diagram of an example of a MOSFET device 100 having a buried region for controlling the off capacitance of the transistor, according to various embodiments. The MOSFET device 100 can be an example of a MOSFET RF switch used to route, couple, or amplify signals in the RF signal chain of a wireless communication device. The MOSFET device 100 can include a source terminal 135, a drain terminal 140, a gate terminal 160, a body terminal 165, and a buried layer terminal 150. In some examples, the MOSFET device 100 can also include a substrate 105, body region 110, and a buried region 115.

The substrate 105 can be a wafer of a high-quality monocrystalline semiconductor material, such as silicon (Si), or any similar substrate material used in the manufacture of semiconductor devices. In some examples, the substrate 105 can be doped with an n-type material, such as to the give the substrate a first conductivity type (e.g., electrons as a majority charge carrier). In other examples, the substrate 105 can doped with a p-type material, such as to the give the substrate a first conductivity type (e.g., holes as a majority charge carrier). In some examples, the dopant concentration of the substrate 105 can be $10^{12}$ to $10^{16}$ atoms per cubic centimeter (atoms/cm³). In certain examples, the substrate 105 can have a thickness that is suitable for fabricating both complementary metal-oxide semiconductor (CMOS) devices and bipolar junction devices using an appropriate BiCMOS process. In some examples, the substrate 105 can be at least 500 nanometers (nm) thick.

The body region 110 can include an area of the substrate 105 that is doped to have a different conductivity type than the substrate and configured to form the body of the MOSFET device 100. In an example, the body region 110 can be a p-well formed in an n-type substrate, such as the substrate 105 doped with an n-type material. In another example, the body region 110 can be an n-well formed in a p-type substrate, such as the substrate 105 doped with a p-type material. Any appropriate MOSFET substrate processing technique can be used to form the body region 110, such as by implanting or diffusing an appropriate dopant material into the substrate 105 and driving the dopant to an indicated depth. En some examples the dopant concentration of the body region can be 5 to 100 times higher than the dopant concentration of the substrate 105. In some examples the body region 110 can be coupled to the body terminal 165, such as by using a body contact (not shown). The body terminal 165 can be used to couple one or more voltages to the body region 110.

The buried region 115 can include an area of the substrate 105 that is doped to have a different conductivity type than the body region 110. In an example, the buried region 115 can be doped with an n-type material to form an n-type region when the body region 110 is a p-type region. Similarly, the buried region 115 can be doped with a p-type material to form an p-type region when the body region 110 is an n-type region. The buried region 115 can have a significantly higher dopant concentration than the body region 110. In some examples, the buried region 115 can be a heavily doped region having a dopant concentration of $10^{18}$ atoms/cm³ to $10^{20}$ atoms/cm³.

The buried region 115 can be configured to deplete regions the body region 110 underlying the source region 120 and the drain region 125, such as in response voltage applied to the body terminal 165 and a voltage applied to the buried region through the buried region terminal 150. Depleting the body region 110 underlying the source region 120 and the drain region 125 can reduce the off capacitance of the MOSFET device 100 by extending the distance between plates of the parasitic capacitor formed between the source region 120 and the body region 101, and the distance between plates of the parasitic capacitor formed between the drain region 125 and the body region.

In some examples, the buried region terminal 150 can be coupled to the buried region 115 using the buried region contact 130. In other examples, the buried region terminal 150 can be omitted, and the contact 130 can be configured to couple the buried region 115 to the substrate 105.

As shown in FIG. 1, the buried region 115 can be disposed underneath all or a portion of the body region 110. The buried region 115 can also be disposed at a distance D from the source region 120 and the drain region 125. In some examples, the dopant concentration of the body region 110 or the distance of the buried region from the source region 120 or the drain region 125 can determine the voltages to apply to the body contact 165 and the buried region contact 150 to reduce off capacitance of the MOSFET device 100. The potential difference between the body region 110 and the buried region 115 at which the off capacitance of the MOSFET device 100 is reduced an indicated amount can decrease as the dopant concentration of the body region decreases relative to the dopant concentration of the buried region. Such potential difference can also decrease as the distance D is decreased.

The source region 120 and the drain region 125 can include doped regions of the body region 110 that are coupled, respectively, to source terminal 135 and drain terminal 140. These regions can be configured to operate as the source and drain of the MOSFET device 100. In some examples, the source region 120 and the drain region 125 can have the same conductivity type as the buried region 115.

The gate of the MOSFET device 100 can be formed by a region of insulting material 145, such as silicon-oxide, and a region 155 of conductive or semi-conductive material. In some examples, the region 155 can be a region of polysilicon or metal. The gate terminal 160 can be coupled to the polysilicon 155 to provide electrical contact between the gate and other circuit components.

The MOSFET device 100 can be fabricated using any suitable CMOS or BiCMOS transistor fabrication process. Additionally, doped regions of the MOSFET device 100 can be formed using any suitable dopants used in these fabrication processes. As an example, n-type dopants can include arsenic, phosphorous, or antimony, while p-type dopants can include aluminum, boron, gallium, or indium. The source terminal 135, drain terminal 140, buried region terminal 150, gate terminal 160, or body terminal 165 can be formed using any suitable electrically conductive material used to form such terminals, such as metallic elements or compounds capable of forming an ohmic contact with the indicated regions of the MOSFET device 100.

Figure 2A:
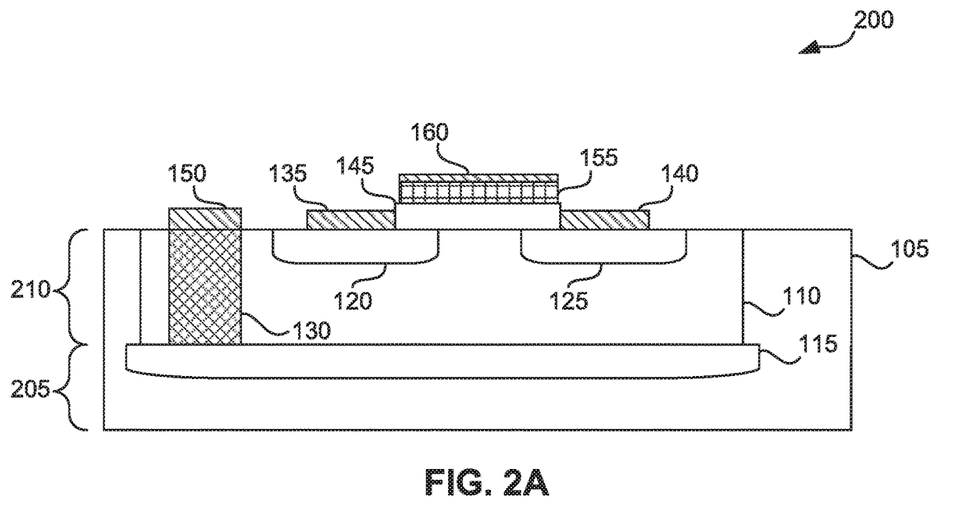
FIG. 2A illustrates a cross-sectional diagram of an example of a metal oxide semiconductor field effect transistor having a doped buried region for controlling the off capacitance of the device, according to various embodiments.

FIG. 2A illustrates a cross-sectional diagram of an example of a MOSFET device 200 having a doped buried region 115 for controlling the off capacitance of the device, according to various embodiments. The MOSFET device 200 can be an example of the MOSFET device 100. As shown in FIG. 2A, the buried region 115 can underly the body region 110, the source region 120, and the drain region 125. Additionally, FIG. 2A shows that the substrate 105 can include a substrate layer 205 and an epitaxial layer 210. In some examples, the epitaxial layer 210 can be formed over the substrate layer 205 after forming the buried region 115.

Figure 2B:
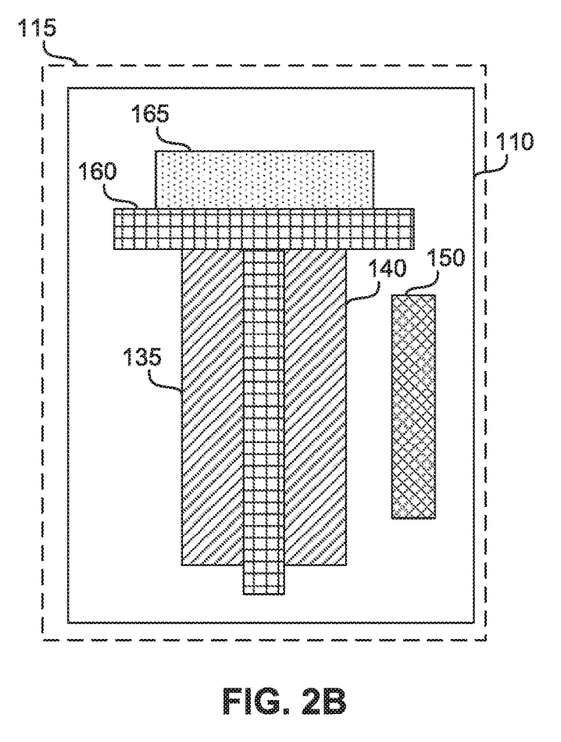
FIG. 2B illustrates a top-down diagram of an example of a metal oxide semiconductor field effect transistor having a doped buried region for controlling the off capacitance of the device, according to various embodiments.

FIG. 2B illustrates a top-down diagram of an example of the MOSFET devices shown in FIGS. 1 and 2A. FIG. 2B shows example top-down geometries, and the relative positions, of the body region 110, the buried region 115, and the terminals of the MOSFET device.

Figure 3:
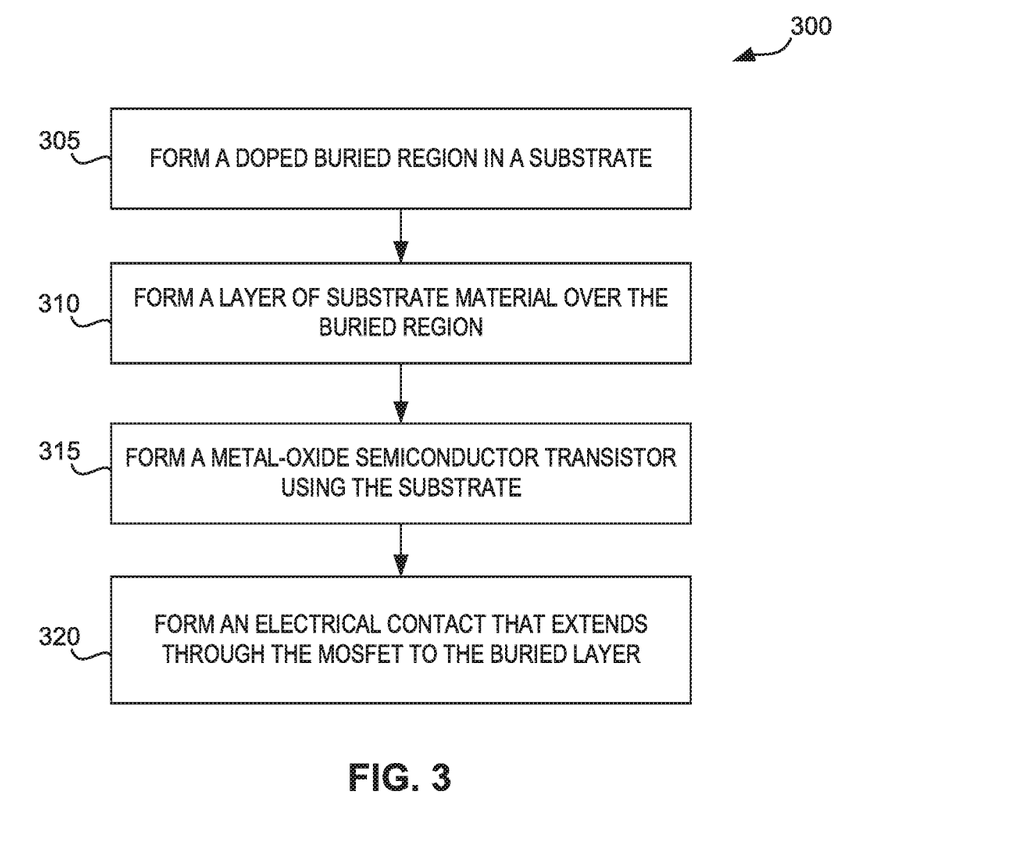
FIG. 3 illustrates an example of a process used to fabricate a metal oxide semiconductor field effect transistor having a doped buried region for controlling the off capacitance of the device, according to various embodiments.

FIG. 3 illustrates an example of a process 300 that can be used to fabricate the MOSFET device 100 (FIG. 1) or the MOSFET device 200 (FIG. 2A), while FIGS. 4A, 4B, 4C, and 4D illustrate example cross-sectional diagrams of the devices at each step in the fabrication process.

Figure 4A:
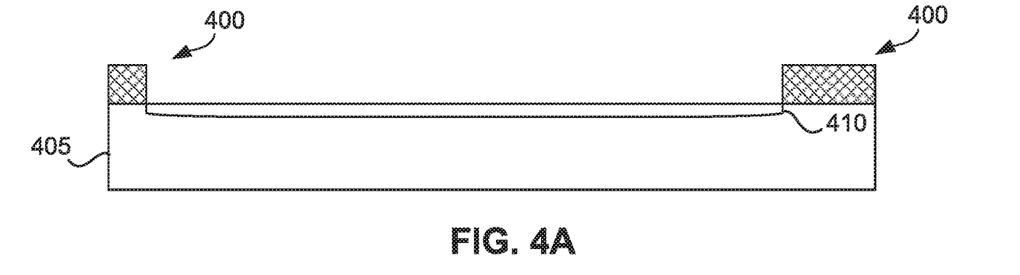
FIGS. 4A, 4B, 4C, and 4D illustrate cross-sectional diagrams of example stages in the fabrication of a metal oxide semiconductor field effect transistor having a doped buried region for controlling the off capacitance of the device, according to various embodiments.
Figure 4B:
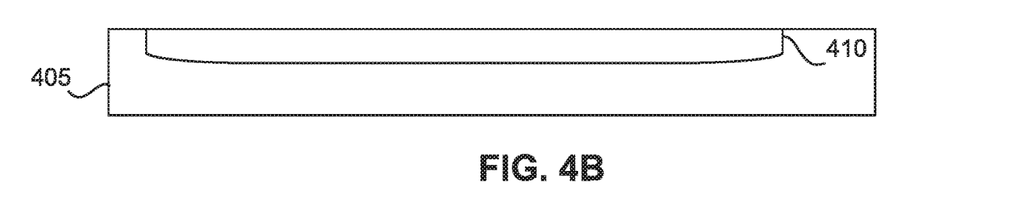

At 305, a buried region 410 can be formed in the substrate 405, as shown in FIG. 4A. Forming the doped buried region 410 can include patterning the substrate 405 to form a mask 400, such as to define the geometry or shape of the buried region 410. Ions of a dopant material can then be implanted in to the substrate at the regions exposed by the mask 400. An annealing or drive-in step can them be performed to extend the depth of the buried region 410 or to repair defects in the substrate caused by the implantation process, as shown in FIG. 4B.

Figure 4C:
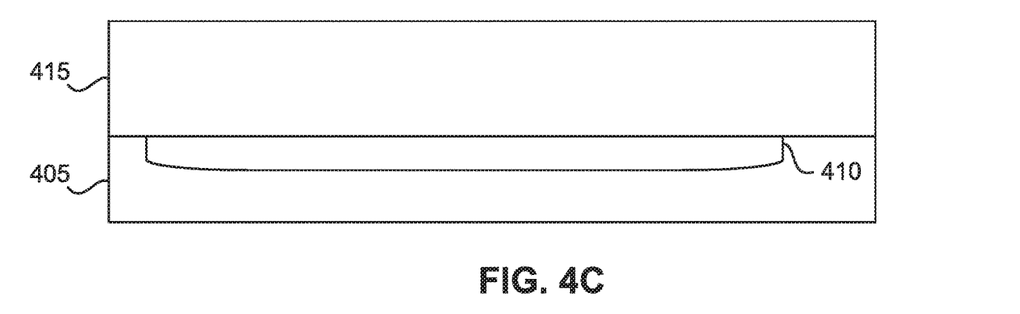

At 310, a layer of substrate material 415 can be formed over the substrate 405 and the buried region 410. The layer of substrate material 415 can have the same conductivity type as the substrate 405 and can be epitaxially grown to a height suitable for forming the MOSFET device 100 or the MOSFET device 200. In some examples, the layer of substrate material 415 can be epitaxially grown to a height suitable for forming BiCMOS devices using the substrate 405 and the layer of substrate material. In certain examples, the layer of substrate material 415 can have a height of at least 500 nm.

Figure 4D:
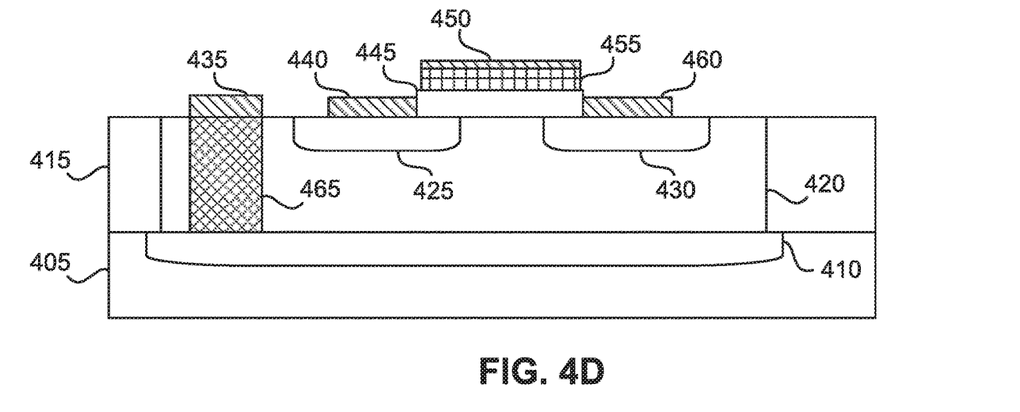

At 315, the substrate 405 and layer of substrate material 415 can processed to form the remaining components of the MOSFET device 100 or the MOSFET device 200. As an example, the substrate can be processed to form the body region 420 by patterning the substrate to form a mask for the body region and performing an ion implantation followed by an annealing or ion drive-in step. A layer of gate oxide 445 and a layer polysilicon 455 can then be deposited and patterned to form the gate of the MOSFET device. Another ion implantation step can then be used to dope the polysilicon and to dope the body region 420 to form the source region 425 and the drain region 430. Via or contact holes can then be etched, and metals can be deposited to form the terminals 435, 440, 450, and 460 of the MOSFET device, as shown in FIG. 4D. In an example, at step 320, a contact 465 can be formed in the MOSFET device to couple the buried region 410 to the terminal 435.

Although FIGS. 1, 2A, and 4I) depict the buried regions 115 and 410 coupled to a distinct MOSFET device terminal, in some examples, the MOSFET devices constructed according to the present disclosure can be constructed without a distinct terminal coupled to the buried region. In particular examples, the buried region of a MOSFET device that is fabricated according to the present disclose can be coupled to the substrate of the device. The substrate, in turn, can be tied or coupled to an indicated voltage, such as to deplete or controllably reduce the off capacitance of the MOSFET device, as described herein.

Figure 5:
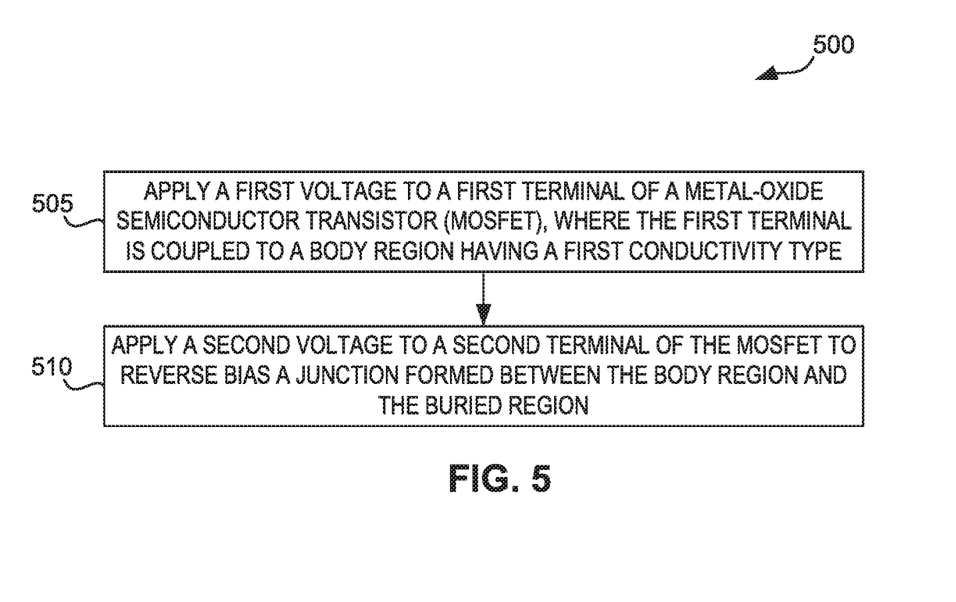
FIG. 5 illustrates an example of a process used to operate a metal oxide semiconductor field effect transistor having a doped buried region for controlling the off capacitance of the device, according to various embodiments.

FIG. 5 illustrates an example of a process 500 that can be used to operate a MOSFET device having a buried region for controlling the off capacitance of the transistor, according to various embodiments. The MOSFET device can be an example of the MOSFET 100 or the MOSFET 200. The process 500 can be implemented in a circuit or executed to selectively reduce the off capacitance of a MOSFET device constructed according to the techniques of the present disclosure. At 505, a voltage can be applied to a first terminal coupled to the body region of the MOSFET. The body region can have a first conductivity type, such as a hole or electron majority charge carrier. At 510, a second voltage can be applied to a second terminal coupled to a buried region of the MOSFET device, as described herein. The buried region can have a second conductivity type that is different form the conductivity type of the body region. In an example, the MOSFET device can be an n-channel MOSFET having the second terminal coupled to the buried region and configured to coupled to a ground potential. When the MOSFET is turned off, the first terminal can be coupled to a negative voltage source having a magnitude selected to reverse bias the junction formed between the body region and the buried layer. In some examples, the first terminal can be coupled to a negative power supply rail. In other examples, the first terminal can be coupled to a controllable voltage source that can be used to controllably adjust the off capacitance of the MOSFET device. The first terminal can be coupled to ground when the MOSFET device of turned on, such as to enable normal operation the device.

Examples of the present disclosure can include a circuit to selectively adjust an off capacitance of a MOSFET. The circuit can include a MOSFET formed on a substrate, where the MOSFET includes a source and drain region of a first conductivity type, a body region of a second conductivity type, and a buried region of the first conductivity type. The body region can be disposed adjacent to the source region and the drain region, while the buried region can underly at least a part of the body region. The circuit can also include a sub-circuit that is configured to apply a voltage to the body region and to the buried region. The voltage can be controllably adjusted to deplete a region of the body region under, or adjacent to, the source region and the drain region, such as by reverse biasing a junction formed by the body region and the buried region. In some examples, the circuit can additionally include a MIT formed using the substrate. In certain examples, the sub-circuit can be configured to provide substantially the same voltage to the body region and the buried region.

Although the above discussion discloses various example embodiments, it should be apparent that those skilled in the art can make various modifications that will achieve some of the advantages of the invention without departing from the true scope of the invention.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A circuit to operate a metal-oxide semiconductor field effect transistor (MOSFET), the circuit comprising:
   a MOSFET comprising:
   a source region and a drain region of a first conductivity type;
   a body region of a second conductivity type, the body region underlying at least a portion of the source region and the drain region; and
   a buried region of the first conductivity type, the buried region disposed between the body region and a substrate, the buried region configured with a dopant concentration or at a distance from the source or drain region to reduce a capacitance between the source region and the drain region by depleting the body region adjacent to the drain region or the source region responsive to a reverse bias voltage applied to the body region; and
   a sub-circuit coupled to the body region to selectively apply the reverse bias voltage to the body region when the MOSFET is turned off and selectively remove the reverse bias voltage when the MOSFET is turned on.

2. The circuit of claim 1, wherein to reduce a capacitance between the source region and the drain region, the buried region is configured to deplete a region of the body region underlying the source region and the drain region in response to the reverse bias voltage being applied between the body region and the buried region.

3. The circuit of claim 1, wherein the all reverse bias voltage is configured to reverse bias a junction formed at an interface between the body region and the buried region when the MOSFET is turned off.

4. The circuit of claim 1, wherein:
   the body region comprises an p-type doped material and the buried region comprises an n-type doped material, or
   the body region comprises an n-type doped material and the buried region comprises a p-type doped material.

5. The circuit of claim 1, wherein the buried region has a doping level that is at least 2000 times as high as a doping level of the body region.

6. The circuit of claim 1, wherein the substrate further comprises a bipolar junction transistor.

7. The circuit of claim 1, wherein the buried region has a doping level that is higher than a doping level of the body region.

8. The circuit of claim 1, further comprising:
   a first terminal coupled to the body region; and
   a second terminal coupled to the buried region.

9. The circuit of claim 1, wherein the buried region is fixedly coupled to a ground voltage.

10. The circuit of claim 1, wherein the sub-circuit selectively couples a ground voltage and the reverse bias voltage to the body region.

11. A method of operating a circuit comprising a metal-oxide semiconductor field effect transistor (MOSFET) to reduce off capacitance of the MOSFET, the method comprising:
    obtaining a MOSFET comprising:
    a source region and a drain region of a first conductivity type;
    a body region of a second conductivity type, the body region underlying at least a portion of the source region and the drain region; and
    a buried region of the first conductivity type, the buried region disposed between the body, region and a substrate, the buried region configured to reduce a capacitance between the source region and the drain region in response to an indicated voltage applied between the body region and the buried region;
    fixedly coupling a first voltage to the buried region;
    reducing the off capacitance of the MOSFET by coupling a second voltage to the body region to reverse bias a junction between the body region and the buried region when the MOSFET is turned off; and
    coupling the first voltage or a third voltage to the body region to remove the reverse bias of the junction between the body region and the buried region when the MOSFET is turned on.

12. The method of claim 11, wherein fixedly coupling a first voltage to the buried region comprises coupling the buried region to electrical ground both when the MOSFET is turned on and when the MOSFET is turned off.

13. The method of claim 11, wherein fixedly coupling the buried region to a first voltage comprises fixedly coupling a voltage of the substrate to the buried region.

14. The method of claim 11, wherein the second conductivity type is n-type, the first voltage is electrical ground, and the second voltage is a negative supply voltage.

15. The method of claim 11, wherein reducing the off capacitance of the MOSFET coupling the second voltage to the body region to reverse bias the junction between the body region and the buried region when the MOSFET is turned off comprising depleting a region of the body region adjacent to the source region and the drain region.

16. A circuit to selectively adjust an off capacitance of a metal-oxide semiconductor field effect transistor (MOSFET), the circuit comprising:
    a MOSFET formed on a substrate, the MOSFET comprising:
    a source region and a drain region of a first conductivity type,
    a body region of a second conductivity type disposed adjacent to the source region and the drain region, and
    a buried region of the first conductivity type, the buried region underlying at least a part of the body region; and
    a sub-circuit configured to:
    provide a reverse biasing voltage between the body region and the buried region when the MOSFET is turned off, and provide equal voltages to the body region and the buried region when the MOSFET is turned on.

17. The circuit of claim 16, further comprising a bipolar junction transistor formed on the substrate.

18. The circuit of claim 16, wherein the sub-circuit is configured to provide substantially the same voltage to the body region and the buried region.

19. The circuit of claim 16, wherein the buried region has a doping level that is higher than a doping level of the body region.

20. The circuit of claim 16, where the buried region is electrically coupled to the substrate.

21. The circuit of claim 16, where the sub-circuit configured to fixedly couple the buried region to electrical ground when the MOSFET is turned on and when the MOSFET is turned Off.

* * * * *

UNITED STATES PATENT AND TRADEMARK OFFICE
CERTIFICATE OF CORRECTION

PATENT NO. : 11,145,722 B2  
APPLICATION NO. : 16/293464  
DATED : October 12, 2021  
INVENTOR(S) : Wu et al.

Page 1 of 1

It is certified that error appears in the above-identified patent and that said Letters Patent is hereby corrected as shown below:

In the Claims

In Column 7, Line 53, in Claim 3, before "the", delete "all"

In Column 8, Line 23, in Claim 11, delete "body," and insert --body-- therefor

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*